(12) United States Patent
Dandia et al.

(10) Patent No.: US 6,246,121 B1
(45) Date of Patent: Jun. 12, 2001

(54) HIGH PERFORMANCE FLIP-CHIP SEMICONDUCTOR DEVICE

(75) Inventors: Sanjay Dandia, San Jose; Jayarama N. Shenoy, Santa Clara, both of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/290,154

(22) Filed: Apr. 12, 1999

(51) Int. Cl.[7] ............................ H01L 23/48; H01L 23/52; H01L 29/40
(52) U.S. Cl. ...................... 257/778; 257/737; 257/773; 257/776; 257/786; 257/780; 257/207; 257/208
(58) Field of Search .................................. 257/778, 773, 257/737, 786, 776, 203–210

(56) References Cited

U.S. PATENT DOCUMENTS

| | | | |
|---|---|---|---|
| 5,379,191 | * | 1/1995 | Carey et al. ........................ 361/777 |
| 5,686,764 | * | 11/1997 | Fulcher ................................ 527/778 |
| 5,814,891 | * | 9/1998 | Hirano ................................ 257/778 |
| 5,866,942 | * | 2/1999 | Suzuki et al. ....................... 257/698 |
| 5,952,726 | * | 9/1999 | Liang .................................. 257/778 |

* cited by examiner

Primary Examiner—Tom Thomas
Assistant Examiner—Nitin Parekh
(74) Attorney, Agent, or Firm—Mikio Ishimaru (57) ABSTRACT

A flip-chip semiconductor device with generic bump patterns formed on a semiconductor substrate and having optimized electrical performance is provided. In a preferred embodiment, the flip-chip semiconductor device includes a semiconductor substrate on which active elements are formed and which has a surface having a plurality of peripheral portions, the active elements including Input/Output (I/O) circuitry and logic circuitry, a first power supply wiring and a first ground wiring disposed in the semiconductor substrate, a signal wiring disposed in the semiconductor substrate, and a first plurality of bumps arranged on the plurality of peripheral portions and selectively used for coupling the semiconductor substrate to a second substrate. The first plurality of bumps are arranged in a matrix pattern of 6 rows by n columns. Bumps in predetermined locations in the matrix are selectively coupled to the first power supply wiring and the first ground wiring.

22 Claims, 7 Drawing Sheets

HIGH PERFORMANCE FLIP-CHIP SEMICONDUCTOR DEVICE

TECHNICAL FIELD

The present invention relates generally to electronic devices and more specifically to high performance flip-chip semiconductor devices.

BACKGROUND ART

High performance microelectronic or semiconductor devices often use solder bumps ("bumps") for electrical and mechanical connection to other microelectronic devices or substrates. This connection technology is commonly referred to as "flip-chip" technology.

In the flip-chip technology, a plurality of bumps formed of low melting point metal is provided in a predetermined position ("bump pattern") on the surface of a semiconductor substrate on which active elements are formed. The semiconductor substrate is then connected to a circuit board or another substrate, such as a flip-chip package. The package includes pads that are the mirror image of the bump pattern on the semiconductor substrate. The semiconductor substrate is connected to the flip-chip package at one time by reflow melting of the bumps.

One of the drawbacks of the conventional flip-chip technology is that for each semiconductor device, a custom bump pattern is provided on the associated semiconductor substrate, which in turn requires a custom package with a custom pad pattern that mirrors the bump pattern on the semiconductor substrate. The requirements for custom packages adversely increase the design cycle time and the cost of using the flip-chip technology.

Attempts have been made in the art to provide generic bump patterns for a semiconductor substrate. However, those attempts have not been very successful as they typically fail to achieve an optimized electrical performance (i.e., higher speed and lower noise) for a large variety of semiconductor devices. A solution which would provide a generic bump patterns on semiconductor substrates while optimizing the electrical performance of the associated semiconductor devices has been long sought but has eluded those skilled in the art. As the semiconductor industry is moving at an increasing pace to higher performance semiconductor devices, it is becoming more pressing that a solution be found.

DISCLOSURE OF THE INVENTION

The present invention provides a flip-chip semiconductor device with generic bump patterns formed on a semiconductor substrate.

The present invention provides a flip-chip semiconductor device with generic bump patterns formed on a semiconductor substrate and optimized electrical performance.

The present invention further provides a flip-chip semiconductor device which includes a semiconductor substrate on which active elements are formed and which has a surface having a plurality of peripheral portions, the active elements including Input/Output (I/O) circuitry and logic circuitry; a first power supply wiring and a first ground wiring disposed in the semiconductor substrate; a signal wiring disposed in the semiconductor substrate; and a first plurality of bumps arranged on the plurality of peripheral portions and selectively used for coupling the semiconductor substrate to a second substrate. The first plurality of bumps are arranged in a matrix pattern of 6 rows by n columns and includes a first row, a second row, a third row, a fourth row, a fifth row and a sixth row. The bumps among the first plurality of bumps which are on the first row are those lying on the innermost peripheral portions, and the bumps among the first plurality of bumps which are on the sixth row are those lying on the outermost peripheral portions. The bumps among the first plurality of bumps, which are on a row with a higher number, are set in position with increased spacing outwardly deviated from the innermost peripheral portions. The first plurality of bumps which are lying on the third row of a first column and a second column that is adjacent to the first column are coupled to the first ground wiring, and the first plurality of bumps which are lying on the sixth row of the first and second columns are coupled to the first power supply wiring. The first plurality of bumps which are lying on the third row of a third column that is adjacent to the second column and a fourth column that is adjacent to the third column are coupled to the first power supply wiring, and the first plurality of bumps which are lying on the sixth row of the third and the fourth column are coupled to the first ground wiring.

The above and additional advantages of the present invention will become apparent to those skilled in the art from a reading of the following detailed description when taken in conjunction with the accompanying drawings.

BEST MODE FOR CARRYING OUT THE INVENTION

The present invention provides generic bump patterns on semiconductor substrates of flip-chip semiconductor devices, while optimizing the electrical performance of the semiconductor devices.

Figure 1A:
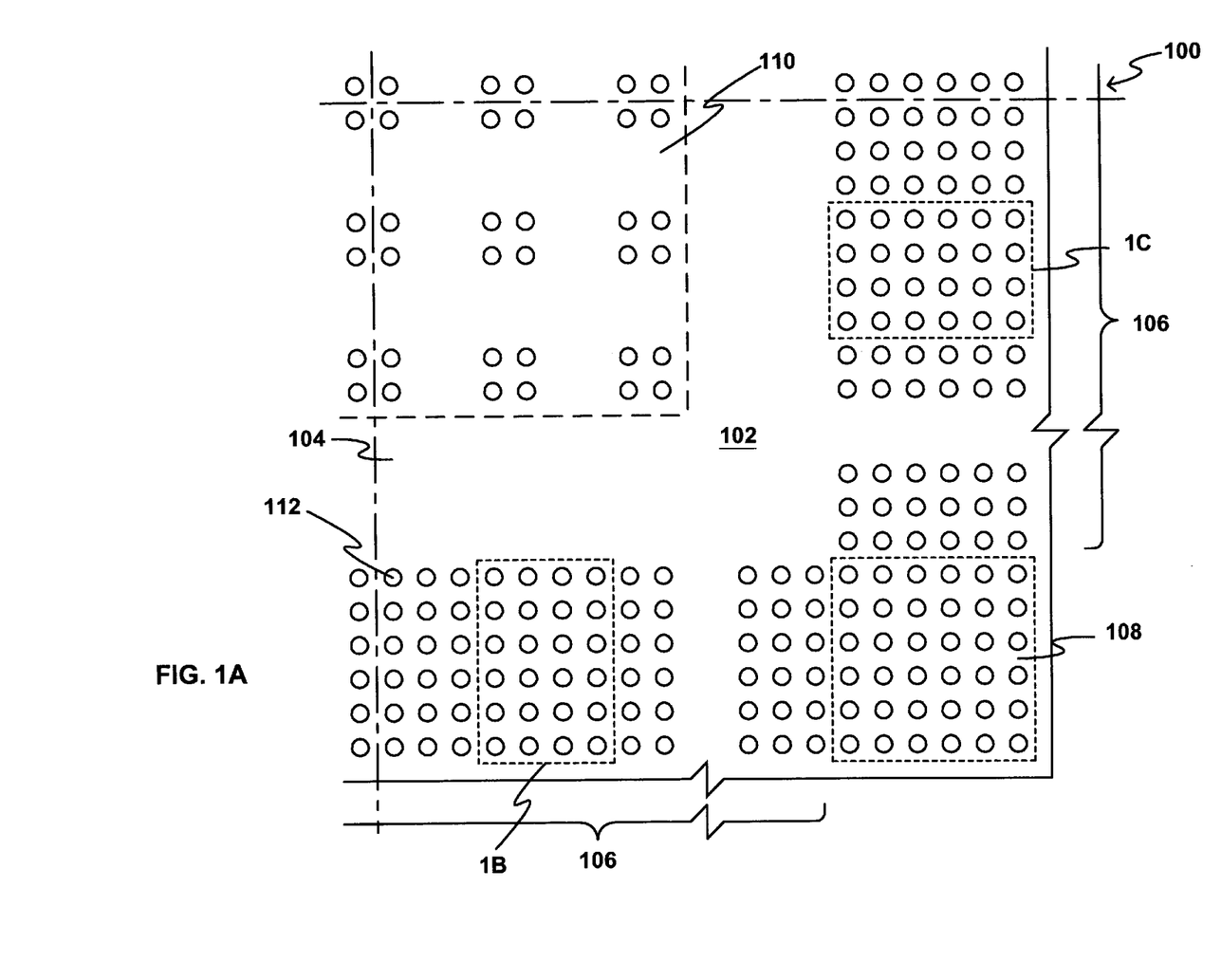
FIG. 1A is a top view of one quadrant of a flip-chip semiconductor device 100.
Figure 1B:
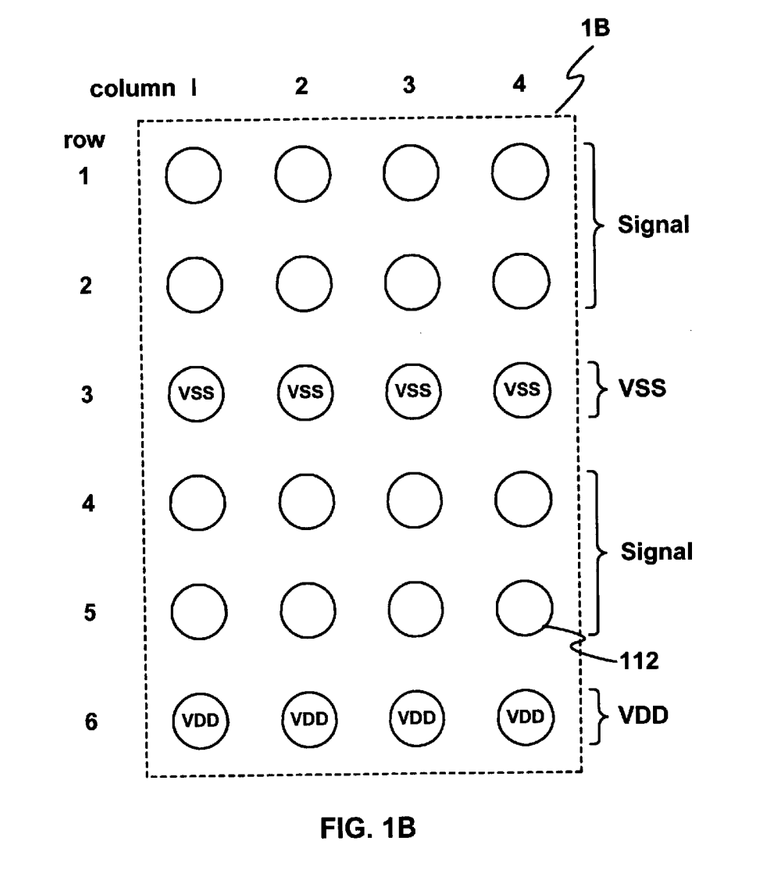
FIG. 1B is a partial view of FIG. 1A which includes an enlarged view of portion 1B of FIG. 1A.

FIGS. 1A and 1B show an example of a bump pattern design constructed in accordance with the present invention.

Referring now to FIG. 1A, therein is shown a top view of one quadrant of a flip-chip semiconductor device 100 constructed in accordance with the present invention. The semiconductor device 100 includes a semiconductor substrate 102 on which active elements (not shown) are formed. The active elements include input/output (I/O) circuitry (not shown) and logic circuitry (not shown). The semiconductor substrate 102 includes a surface 104 that has a plurality of peripheral portions 106, a plurality of corner portions 108 and a center portion 110. Bumps 112 are formed on the plurality of peripheral portions 106, the plurality of corner portions 108 and the center portion 110. The plurality of peripheral portions 106 includes a first plurality of bumps 112 arranged in a matrix pattern of 6 rows by n columns. In a preferred embodiment, n is equal to 38. In another preferred embodiment, n is equal to 39. The semiconductor device 100 also includes VDD (a first power supply) wiring and VSS (a first ground) wiring (not shown) disposed in the semiconductor substrate 102 and are coupled to the I/O circuitry. The semiconductor device 100 further includes signal wiring (not shown).

Referring now to FIG. 1B, therein is shown a partial view of FIG. 1A which includes an enlarged view of portion 1B of FIG. 1A. FIG. 1B shows the bump pattern arranged in a 6 row by 4 column matrix on the peripheral portion 106. The first row is the innermost row on the peripheral portion 106, while the sixth row is the outermost row on the peripheral portion 106. The bumps 112 which are lying on the third row are coupled to the VSS wiring and the bumps 112 which are lying on the sixth row are coupled to the VDD wiring. The bumps 112 that are isolated from the VSS wiring and the VDD wiring could be coupled to the signal wiring. In this preferred embodiment, the bumps 112 that are isolated from the VSS wiring and the VDD wiring are coupled to the signal wiring. This bump pattern can be repeated throughout each of the plurality of peripheral portions 106.

Figure 1C:
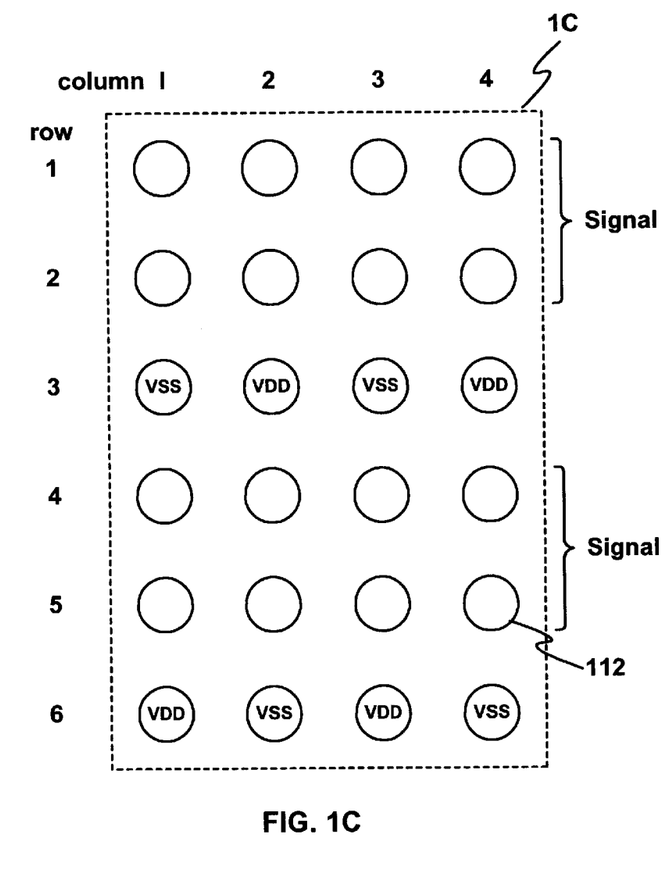
FIG. 1C is a partial view of FIG. 1A which includes an enlarged view of portion 1C of FIG. 1A.

Referring now to FIG. 1C, therein is shown a partial view of FIG. 1A which includes an enlarged view of portion 1C of FIG. 1A. FIG. 1C shows the bump pattern arranged in a 6 row by 4 column matrix on the peripheral portion 106. The first row is the innermost row on the peripheral portion 106, while the sixth row is the outermost row on the peripheral portion 106. The bumps 112 which are lying on the third row of a first column, the sixth row of a second column that is adjacent to the first column, the third row of a third column that is adjacent to the second column, and the sixth row of a fourth column that is adjacent to the third column are coupled to the VSS wiring. The bumps 112 which are lying on the sixth row of the first column, the third row of the second column, the sixth row of the third column, and the third row of the fourth column are coupled to the VDD wiring. The bumps that are isolated from the VSS wiring and the VDD wiring could be coupled to the signal wiring. In this preferred embodiment, the bumps that are isolated from the VSS wiring and the VDD wiring are coupled to the signal wiring. When n equals an even number, this bump pattern can be repeated throughout each of the plurality of peripheral portions 106. When n equals an odd number, this bump pattern can be repeated throughout each of the plurality of peripheral portions 106 except for one column which could be the column that is immediately adjacent to one of the plurality of corner portions 108.

Figure 2A:
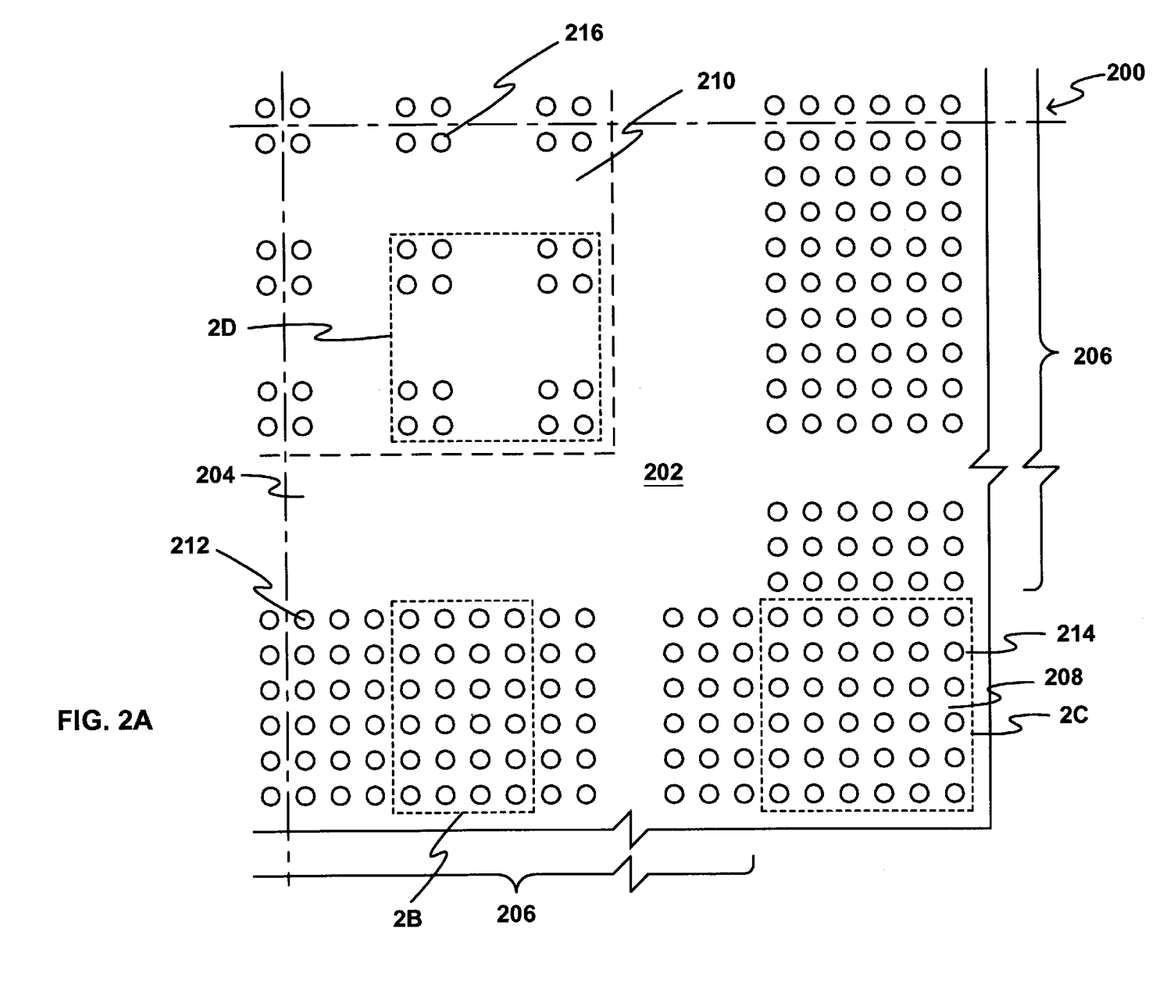
FIG. 2A, is a top view of one quadrant of a flip-chip semiconductor device 200 constructed in accordance with the present invention.

Referring now to FIG. 2A, therein is shown a top view of one quadrant of a flip-chip semiconductor device 200 constructed in accordance with the present invention. The semiconductor device 200 includes semiconductor substrate 202 on which active elements (not shown) are formed. The active elements include an input/output (I/O) circuitry (not shown) and a logic circuitry (not shown). The semiconductor substrate 202 includes a surface 204 that has a plurality of peripheral portions 206, a plurality of corner portions 208 and a center portion 210. The plurality of peripheral portions 206 includes a first plurality of bumps 212 arranged in a matrix pattern of 6 rows by n columns. In a preferred embodiment, n is equal to 38. In another preferred embodiment, n is equal to 39. The plurality of corner portions 208 include a second plurality of bumps 214 arranged in a matrix pattern of 6 rows by 6 columns. The center portion 210 includes a third plurality of bumps 216 arranged in plurality of matrix patterns of 2 rows by 2 columns. The semiconductor device 200 also includes VDD (a first power supply) wiring (not shown) and VSS (a first ground) wiring (not shown) disposed in the semiconductor substrate 202 and are coupled to the I/O circuitry. The semiconductor device 200 also includes VDDC (a second power supply) wiring and VSSC (a second ground) wiring (not shown) disposed in the semiconductor substrate 202 and is coupled to the logic circuitry. The first power supply wiring and the first ground wiring may be kept separate from the second power supply wiring and the second ground wiring, respectively, so that noise due to switching of the I/O circuitry will not appear on the power and ground for the logic circuitry. The semiconductor device 200 further includes a signal wiring (not shown) disposed in the semiconductor substrate 202.

Figure 2B:
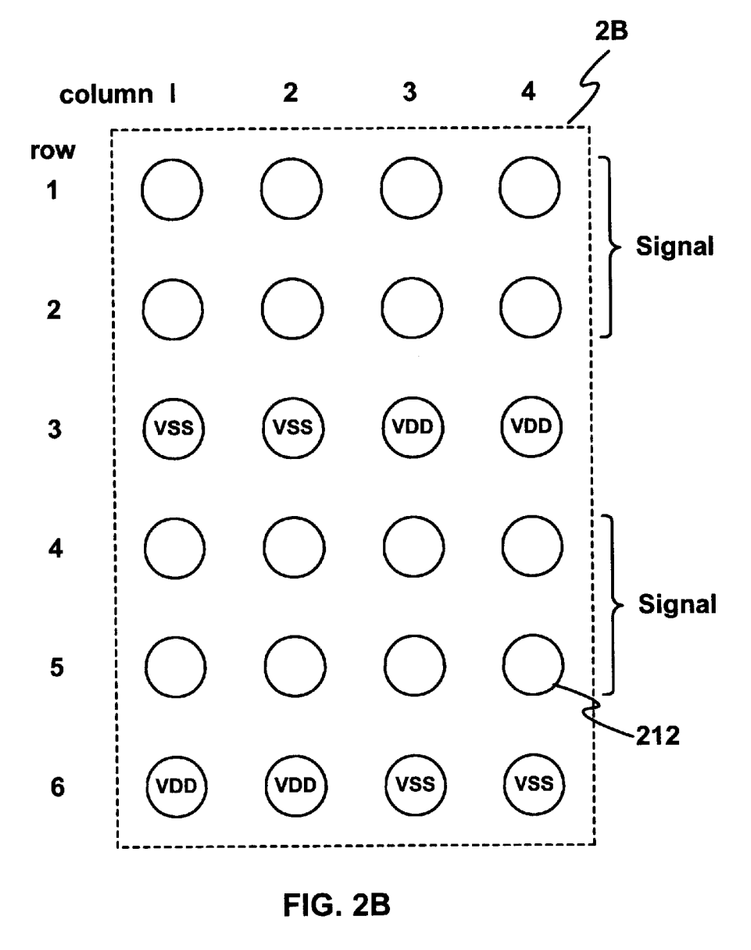
FIG. 2B is a partial view of FIG. 2A which includes an enlarged view of portion 2B of FIG. 2A.

Referring now to FIG. 2B, therein is shown a partial view of FIG. 2A, which includes an enlarged view of portion 2B of FIG. 2A. FIG. 2B shows the bump pattern arranged in a 6 row by 4 column matrix on the peripheral portion 206 constructed in accordance with the present invention. The bump pattern includes a first row, a second row, a third row, a fourth row, a fifth row, and a sixth row. The first row is the innermost row on the peripheral portion 206, while the sixth row is the outermost row on the peripheral portion 206. The bumps among said first plurality of bumps 212 which are on a row with a higher number are set in position with increased spacing outwardly deviated from said innermost peripheral portions. The bump pattern also includes a first column, a second column, a third column, and a fourth column. The bumps 212 which are lying on the third row of the first and the second columns are coupled to the VSS wiring, and the bumps 212 which are lying on the sixth row of the first and second columns are coupled to the VDD wiring. The bumps 212 which are lying on the third row of the third and the fourth columns are coupled to the VDD wiring, and the bumps 212 which are lying on the sixth row of the third and the fourth columns are coupled to the VSS wiring. When n equals an even number, this bump pattern can be repeated throughout each of the plurality of peripheral portions 206. When n equals an odd number, this bump pattern can be repeated throughout each of the plurality of peripheral portions 206 except for one column which could be the column that is immediately adjacent to one of the plurality of corner portions 206.

Figure 2C:
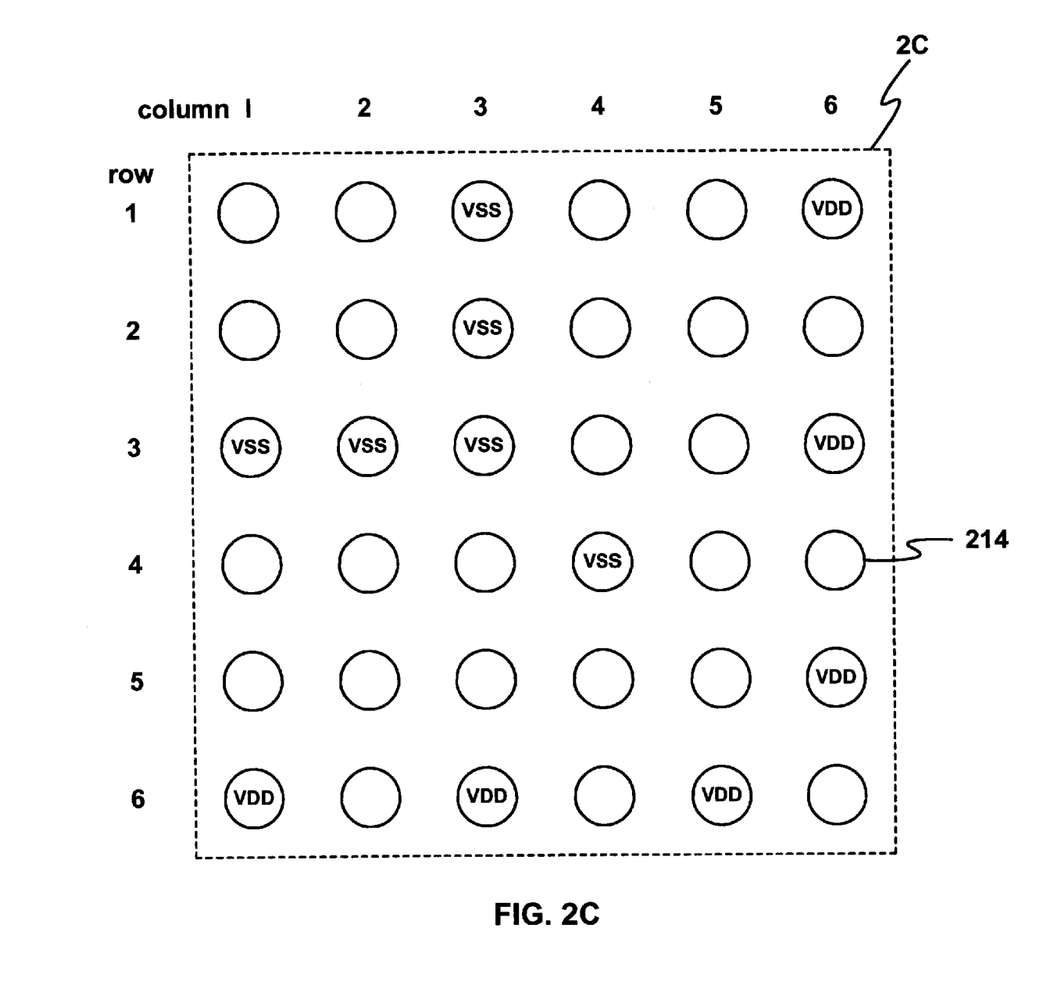
FIG. 2C is a partial view of FIG. 2A which includes an enlarged view of portion 2C of FIG. 2A.

Referring now to FIG. 2C, therein is shown a partial view of FIG. 2A, which includes an enlarged view of portion 2C of FIG. 2A. FIG. 2C shows the bump patterns arranged in a 6 row by 6 column matrix on the corner portion 206 constructed in accordance with the present invention. The second plurality of bumps 214 is arranged in a matrix pattern of 6 rows by 6 columns on the corner portion 208 and are selectively used for coupling the semiconductor substrate to a second substrate. The bump pattern of the second plurality of bumps 214 includes a first row, a second row, a third row, a fourth row, a fifth row, a sixth row, and a first column, a second column, a third column, a fourth column, a fifth column, and a sixth column.

The bumps 214 which are lying on the third row of the first and second columns, the first, second and third rows of the third column, and the fourth row of the fourth column are coupled to the VSS wiring. The bumps 214 which are lying on the sixth row of the first, third, and fifth columns and the first, third, and fifth rows of the sixth column are coupled to the VDD wiring. It should be noted that at least one of the bumps 214 which is isolated from the VSS wiring and the VDD wiring is coupled to the signal wiring. In a preferred embodiment, all of the bumps 214 that are isolated from the VSS wiring and the VDD wiring are coupled to the signal wiring. For the purpose of identifying the orientation of the semiconductor substrate 202, no bump is provided at the bump location which lies on the sixth row of the sixth column of one of the corner portions 208.

Figure 2D:
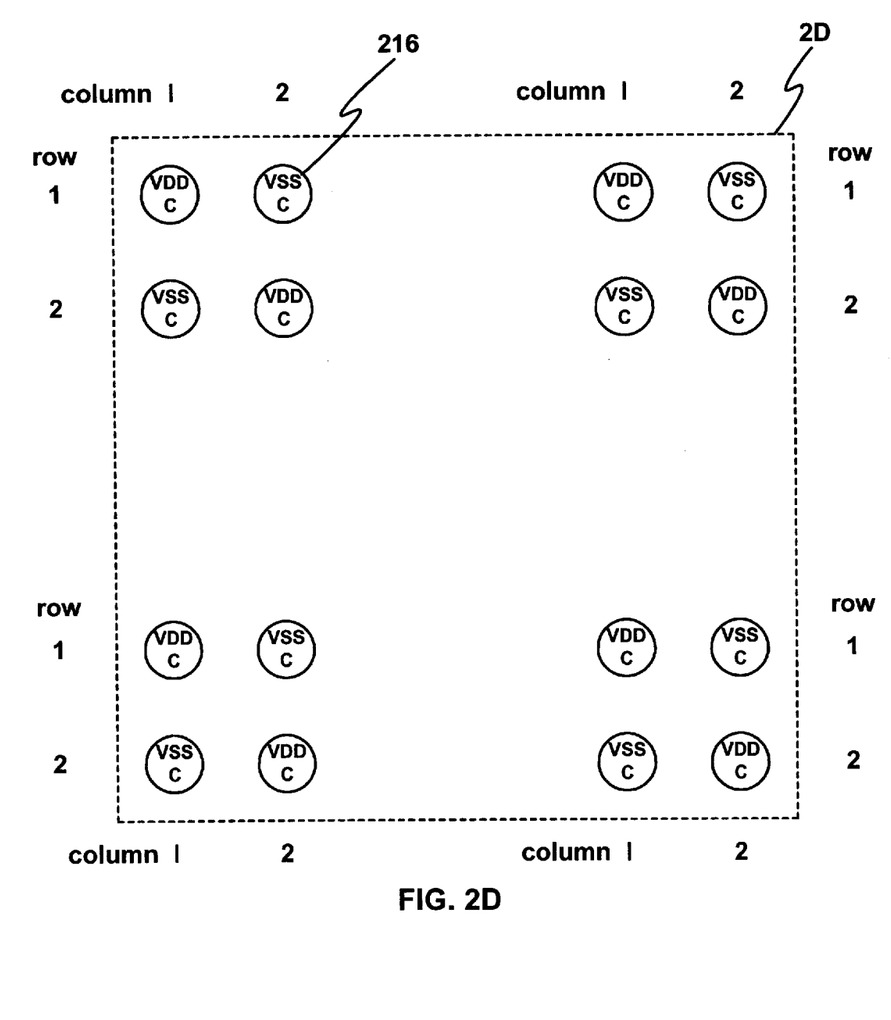
FIG. 2D is a partial view of FIG. 2A which includes an enlarged view of portion 2D of FIG. 2A.

Referring now to FIG. 2D, therein is shown a partial view of FIG. 2A, which includes an enlarged view of portion 2D of FIG. 2A. FIG. 2D shows the bump pattern of the center portion 210 that is arranged in a plurality of matrix patterns of 2 rows by 2 columns. Each of the plurality of matrix patterns includes a first row, a second row, a first column, and a second column. The bumps 216, that are lying on the second row of the first column, and the first row of the second column of each of the plurality of matrix patterns are coupled to the VSSC wiring. The bumps 216 which are lying on the first row of the first column and the second row of the second column of each of the plurality of matrix patterns are coupled to the VDDC wiring.

Figure 3:
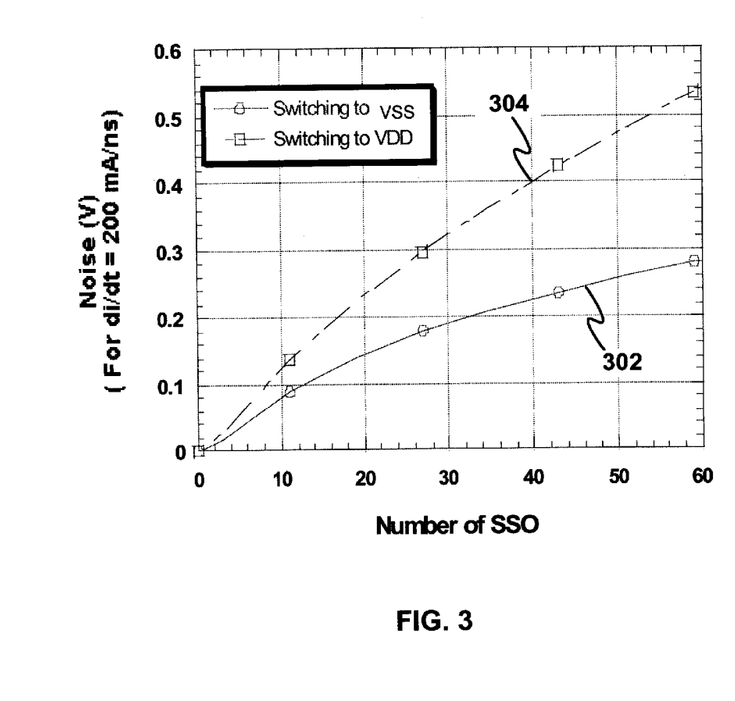
FIG. 3 is a graphical representation of the result of an electrical simulation of simultaneous switching noise of a flip-chip semiconductor device similar to what is shown in FIG. 1A.

Referring now to FIG. 3, therein is shown a graphical representation of the result of an electrical simulation of simultaneous switching noise of a flip-chip semiconductor device constructed in accordance with the present invention similar to what was shown in FIGS. 1A and 1B. In the simulation, only 15 columns of the peripheral bumps are used. The bumps are coupled to the VSS wiring and the VDD wiring in accordance with what was shown in FIG. 1B, i.e., the bumps on the third row are coupled to the first ground wiring, and the bumps on the sixth row are coupled to the first power supply wiring. The bumps (15×4=60 each) which are isolated from the VSS wiring and the VDD wiring are coupled to the signal wiring. The simulation was performed in the AC domain (1A/signal at 1 GHz). Graph 302 shows the simultaneous switching noise (in volts) due to switching of the signal wiring to the VSS as a function of the number of simultaneous switching output (SSO). Graph 304 shows the simultaneous switching noise (in volts) due to switching of the signal wiring to VDD as a function of the number of SSO. It can be seen that there is an asymmetry in the noise level between switching to VSS and switching to VDD, with the latter being about two times worse. This worst case SSO-induced noise saturates at about 0.6 V, which is considered to be high for high speed I/O buffers that a high performance flip-chip device is expected to be used with because these high speed I/O buffers usually have full voltage swings in the 1.5 to 2 V range.

Figure 4:
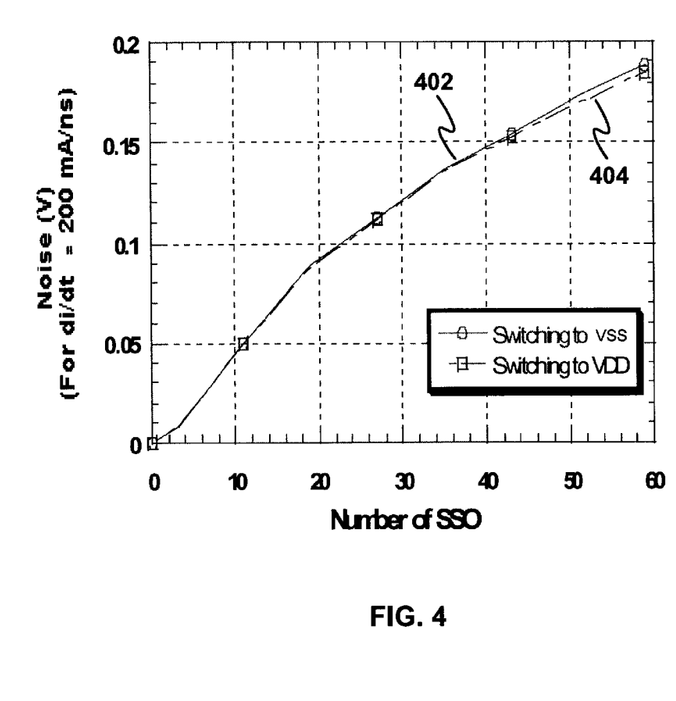
FIG. 4 is a graphical representation of the result of an electrical simulation of simultaneous switching noise of a flip-chip semiconductor device constructed in accordance with the present invention similar to what is shown in FIG. 2A.

Referring now to FIG. 4, therein is shown a graphical representation of the result of an electrical simulation of simultaneous switching noise of a flip-chip semiconductor device constructed in accordance with the present invention, similar to what was shown in FIGS. 2A and 2B. In the simulation, only 15 columns of the peripheral bumps are used. The bumps are coupled to the VSS wiring and the VDD wiring in accordance with what was shown in FIG. 2B. The bump pattern of FIG. 2B is repeated throughout the 15 columns of bumps, except on the last column. The bumps (15×4=60 each) which are isolated from the VSS wiring and the VDD wiring are coupled to the signal wiring. The simulation was performed in the AC domain (1A/signal at 1 GHz). Graph 402 indicates the simultaneous switching noise (in volts) due to switching of the signal wiring to the VSS as a function of the number of SSO. Graph 404 indicates the simultaneous switching noise (in volts) due to switching of the signal wiring to the VDD wiring as a function of the number of SSO. It can be seen that there is insignificant difference in the noise level between switching to VSS and switching to VDD. Further, the worst case SSO-induced noise is about 0.2 V, which is a more acceptable value.

Therefore, the present invention provides a flip-chip semiconductor device with symmetry in SSO-induced noise between switching to VSS and switching to VDD and a significant reduced worst case SSO-induced noise. Accordingly, the electrical performance of the flip-chip semiconductor device is significantly optimized.

In production, a flip-chip semiconductor device 200 is provided (FIG. 2A). The semiconductor device 200 includes semiconductor substrate 202 on which active elements (not shown) are formed. The active elements include input/output (I/O) circuitry (not shown) and logic circuitry (not shown). The semiconductor substrate 202 includes a surface 204 that has a plurality of peripheral portions 206, a plurality of corner portions 208, and a center portion 210. The plurality of peripheral portions 206 includes a first plurality of bumps 212 arranged in a matrix pattern of 6 rows by n columns. The plurality of corner portions 208 includes a second plurality of bumps 214 arranged in a matrix pattern of 6 rows by 6 columns. The center portion 210 includes a third plurality of bumps 216 arranged in a plurality of matrix patterns of 2 rows by 2 columns. The semiconductor device 200 also includes VDD (a first power supply) wiring (not shown) and VSS (a first ground) wiring (not shown) disposed in the semiconductor substrate 202 and are coupled to the I/O circuitry. The semiconductor device 200 also includes VDDC (a second power supply) wiring and VSSC (a second ground) wiring (not shown) disposed in the semiconductor substrate 202 and is coupled to the logic circuitry. The semiconductor device 200 further includes signal wiring (not shown) disposed in the semiconductor substrate 202. The first, second, and third plurality of bumps are coupled to VSS, VDD, VSSC, and VDDC according to what are illustrated in FIGS. 2A through 2D.

Conventional reflow process is used to connect the semiconductor substrate 202 to a circuit board or another substrate, such as a flip-chip package, that includes pads that are the mirror images of the bump patterns on the semiconductor substrate 202.

Therefore, in accordance with the present invention, a flip-chip semiconductor device having a semiconductor substrate with generic bump patterns is provided with optimized electrical performance. By providing generic bump patterns on the semiconductor device, a generic flip-chip package can be used which results in the reduction in design cycle time and cost.

While the best mode utilizes 6 rows of bumps on the peripheral portions as examples, it should be understood that the present invention is applicable to other bump patterns with more or less rows of bumps on the peripheral portions. In addition, the present invention is applicable to n column bumps on peripheral portions where n has a value greater than 39 or less than 38.

As would be evident to those skilled in the art, the present invention would be applicable to forming bump patterns in other electronic devices, such as printed circuit boards, chip(s)-on-board, or the like.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A flip-chip semiconductor device comprising:
    a semiconductor substrate on which active elements are formed and which has a surface having a plurality of peripheral portions, said active elements including an I/O circuitry and a logic circuitry;
    a first power supply wiring and a first ground wiring disposed in said semiconductor substrate;
    a signal wiring disposed in said semiconductor substrate;
    a first plurality of bumps arranged on said plurality of peripheral portions and selectively used for coupling said semiconductor substrate to a second substrate,
    said first plurality of bumps arranged in a matrix pattern of 6 rows by n columns and includes a first row, a second row, a third row, a fourth row, a fifth row, and a sixth row,
        the bumps among said first plurality of bumps which are on the first row are those lying on the innermost peripheral portions,
        the bumps among said first plurality of bumps which are on the sixth row are those lying on the outermost peripheral portions, and
        the bumps among said first plurality of bumps which are on a row with a higher number are set in position with increased spacing outwardly deviated from said innermost peripheral portions;
    said first plurality of bumps, which are lying on the third row of a first column and a second column that is adjacent to said first column, coupled to said first ground wiring;
    said first plurality of bumps, which are lying on the sixth row of said first and second columns, coupled to said first power supply wiring;
    said first plurality of bumps, which are lying on the third row of a third column that is adjacent to said second column and a fourth column that is adjacent to said third column, coupled to said first power supply wiring; and
    said first plurality of bumps, which are lying on the sixth row of said third and said fourth column, coupled to said first ground wiring.

2. The flip-chip semiconductor device as claimed in claim 1 wherein said surface includes a plurality of corner portions, and further comprising:
    a second plurality of bumps arranged on said plurality of corner portions and selectively used for coupling said semiconductor substrate to said second substrate;
    said second plurality of bumps of at least one of said plurality of corner portions arranged in a matrix pattern of six rows by six columns, and includes a first row, a second row, a third row, a fourth row, a fifth row and a sixth row, and a first column, a second column, a third column, a fourth column, a fifth column and a sixth column;
    said second plurality of bumps of said at least one of said plurality of corner portions, which are lying on said third row of said first and second columns, said first, second and third row of said third column, and said fourth row of said fourth column, coupled to said first ground wiring; and
    said second plurality of bumps of said at least one of said plurality of corner portions, which are lying on said sixth row of said first, third and fifth columns, and said first, third, and fifth rows of said sixth column, coupled to said first power supply wiring.

3. The flip-chip semiconductor device as claimed in claim 2 wherein at least one of said second plurality of bumps of said at least one of said plurality of corner portions which is isolated from said second ground wiring and said second power supply wiring is coupled to said signal wiring.

4. The flip-chip semiconductor device as claimed in claim 1 wherein said surface includes a center portion, and further comprising:
    a third plurality of bumps arranged on said center portion and selectively used for coupling said semiconductor substrate to said second substrate;
    a second power supply wiring and a second ground wiring disposed in said semiconductor substrate;
    said third plurality of bumps arranged in a plurality of matrix patterns of two rows by two columns, and each of said plurality of matrix patterns includes a first and a second row and a first and a second column;
    said third plurality of bumps, which are lying on said second row of said first column and said first row of said second column of each of said plurality of matrix patterns, coupled to said second ground wiring; and
    said third plurality of bumps, which are lying on said first row of said first column and said second row of said second column each of said plurality of matrix patterns, coupled to said second power supply wiring.

5. The flip-chip semiconductor device as claimed in claim 4 wherein said second power supply wiring and said second ground wiring are coupled to said logic circuitry.

6. The flip-chip semiconductor device as claimed in claim 1 wherein said first power supply wiring and said first ground wiring are coupled to said I/O circuitry.

7. The flip-chip semiconductor device as claimed in claim 1 wherein at least one of said first plurality of bumps which is isolated from said first ground wiring and said first power supply wiring is coupled to said signal wiring.

8. The flip-chip semiconductor device as claimed in claim 1 wherein said first plurality of bumps which are lying on said first, second, fourth, and fifth rows are coupled to said signal wiring.

9. The flip-chip semiconductor device as claimed in claim 1 wherein n is equal to 38.

10. The flip-chip semiconductor device as claimed in claim 1 wherein n is equal to 39.

11. A flip-chip semiconductor device comprising:
    a semiconductor substrate on which active elements are formed and which has a surface having a plurality of peripheral portions, said active elements including an I/O circuitry and a logic circuitry;
    a first power supply wiring and a first ground wiring disposed in said semiconductor substrate, wherein said first power supply wiring and said first ground wiring are coupled to said I/O circuitry;
    a signal wiring disposed in said semiconductor substrate;
    a first plurality of bumps arranged on said plurality of peripheral portions and selectively used for coupling said semiconductor substrate to a second substrate;
    said first plurality of bumps arranged in a matrix pattern of 6 rows by n columns and includes a first row, a second row, a third row, a fourth row, a fifth row, and a sixth row, the bumps among said first plurality of bumps which are on the first row are those lying on the innermost peripheral portions, the bumps among said first plurality of bumps which are on the sixth row are those lying on the outermost peripheral portions, and the bumps among said first plurality of bumps which are on a row with a higher number are set in position with increased spacing outwardly deviated from said innermost peripheral portions;

said first plurality of bumps, which are lying on the third row of a first column and a second column that is adjacent to said first column, coupled to said first ground wiring;

said first plurality of bumps, which are lying on the sixth row of said first and second columns, coupled to said first power supply wiring;

said first plurality of bumps, which are lying on the third row of a third column that is adjacent to said second column and a fourth column that is adjacent to said third column, coupled to said first power supply wiring;

said first plurality of bumps, which are lying on the sixth row of said third and said fourth column, coupled to said first ground wiring; and at least one of said first plurality of bumps, which is isolated from said first ground wiring and said first power supply wiring, coupled to said signal wiring.

12. The flip-chip semiconductor device as claimed in claim 11 wherein said surface includes a plurality of corner portions, and further comprising:

a second plurality of bumps arranged on said plurality of corner portions and selectively used for coupling said semiconductor substrate to said second substrate;

said second plurality of bumps of at least one of said plurality of corner portions arranged in a matrix pattern of 6 rows by 6 columns, and includes a first row, a second row, a third row, a fourth row, a fifth row, and a sixth row, and a first column, a second column, a third column, a fourth column, a fifth column, and a sixth column;

said second plurality of bumps of said at least one of said plurality of corner portions, which are lying on said third row of said first and second columns, said first, second and third row of said third column, and said fourth row of said fourth column, coupled to said first ground wiring;

said second plurality of bumps of said at least one of said plurality of corner portions, which are lying on said sixth row of said first, third and fifth columns, and said first, third, and fifth rows of said sixth column, coupled to said first power supply wiring; and at least one of said second plurality of bumps of said at least one of said plurality of corner portions, which is isolated from said second ground wiring and said second power supply wiring, coupled to said signal wiring.

13. The flip-chip semiconductor device as claimed in claim 11 wherein said surface includes a center portion, and further comprising:

a third plurality of bumps arranged on said center portion and selectively used for coupling said semiconductor substrate to said second substrate;

a second power supply wiring and a second ground wiring disposed in said semiconductor substrate;

said second power supply wiring and said second ground wiring coupled to said logic circuitry;

said third plurality of bumps arranged in a plurality of matrix patterns of 2 rows by 2 columns, and each of said plurality of matrix patterns includes a first and a second row and a first and a second column;

said third plurality of bumps, which are lying on said second row of said first column and said first row of said second column of each of said plurality of matrix patterns, coupled to said second ground wiring; and said third plurality of bumps, which are lying on said first row of said first column and said second row of said second column of each of said plurality of matrix patterns, coupled to said second power supply wiring.

14. The flip-chip semiconductor device as claimed in claim 11 wherein said first plurality of bumps which are lying on said first, second, fourth, and fifth rows are coupled to said signal wiring.

15. The flip-chip semiconductor device as claimed in claim 11 wherein n is equal to 38.

16. The flip-chip semiconductor device as claimed in claim 11 wherein n is equal 39.

17. A flip-chip semiconductor device comprising:

a semiconductor substrate on which active elements are formed and which has a surface having a plurality of peripheral portions, and a plurality of corner portions, said active elements including I/O circuitry and logic circuitry;

a first power supply wiring and a first ground wiring disposed in said semiconductor substrate, wherein said first power supply wiring and said first ground wiring are coupled to said I/O circuitry;

a signal wiring disposed in said semiconductor substrate;

a first plurality of bumps arranged on said plurality of peripheral portions and selectively used for coupling said semiconductor substrate to a second substrate;

a second plurality of bumps arranged on said plurality of corner portions and selectively used for coupling said semiconductor substrate to said second substrate;

said first plurality of bumps are arranged in a matrix pattern of 6 rows by n columns and includes a first row, a second row, a third row, a fourth row, a fifth row, and a sixth row, the bumps among said first plurality of bumps which are on the first row are those lying on the innermost peripheral portions, the bumps among said first plurality of bumps which are on the sixth row are those lying on the outermost peripheral portions, and the bumps among said first plurality of bumps which are on a row with a higher number are set in position with increased spacing outwardly deviated from said innermost peripheral portions;

said first plurality of bumps, which are lying on the third row of a first column and a second column that is adjacent to said first column, coupled to said first ground wiring;

said first plurality of bumps, which are lying on the sixth row of said first and second columns, coupled to said first power supply wiring;

said first plurality of bumps, which are lying on the third row of a third column that is adjacent to said second column and a fourth column that is adjacent to said third column, coupled to said first power supply wiring;

said first plurality of bumps, which are lying on the sixth row of said third and said fourth column, coupled to said first ground wiring;

at least one of said first plurality of bumps, which is isolated from said first ground wiring and said first power supply wiring, coupled to said signal wiring;

said second plurality of bumps of at least one of said plurality of corner portions are arranged in a matrix pattern of 6 rows by 6 columns, and includes a first row, a second row, a third row, a fourth row, a fifth row, and a sixth row, and a first column, a second column, a third column, a fourth column, a fifth column, and a sixth column;

said second plurality of bumps of said at least one of said plurality of corner portions, which are lying on said third row of said first and second columns, said first, second, and third row of said third column, said fourth row of said fourth column, coupled to said first ground wiring;

said second plurality of bumps, which are lying on said sixth row of said first, third, and fifth columns, and said first, third, and fifth rows of said sixth column, coupled to said first power supply wiring; and at least one of said second plurality of bumps of said at least one of said plurality of corner portions, which is isolated from said second ground wiring and said second power supply wiring, coupled to said signal wiring.

18. The flip-chip semiconductor device as claimed in claim 17 wherein said surface includes a center portion, and further comprising:

a third plurality of bumps arranged on said center portion and selectively used for coupling said semiconductor substrate to said second substrate;

a second power supply wiring and a second ground wiring disposed in said semiconductor substrate;

said second power supply wiring and said second ground wiring coupled to said logic circuitry;

said third plurality of bumps are arranged in a plurality of matrix patterns of 2 rows by 2 columns, and each of said plurality of matrix patterns includes a first and a second row and a first and a second column;

said third plurality of bumps, which are lying on said second row of said first column and said first row of said second column of each of said plurality of matrix patterns, coupled to said second ground wiring; and said third plurality of bumps, which are lying on said first row of said first column and said second row of said second column of each of said plurality of matrix patterns, coupled to said second power supply wiring.

19. The flip-chip semiconductor device as claimed in claim 17 wherein said first plurality of bumps which are lying on said first, second, fourth, and fifth rows are coupled to said signal wiring.

20. The flip-chip semiconductor device as claimed in claim 17 wherein n comprises a number selected from the group consisting of 38 and 39.

21. A flip-chip semiconductor device comprising:

a semiconductor substrate on which active elements are formed and which has a surface having a plurality of peripheral portions, said active elements including an I/O circuitry and a logic circuitry;

a first power supply wiring and a first ground wiring disposed in said semiconductor substrate;

a signal wiring disposed in said semiconductor substrate;

a first plurality of bumps arranged on said plurality of peripheral portions and selectively used for coupling said semiconductor substrate to a second substrate, said first plurality of bumps arranged in a matrix pattern of 6 rows by n columns and includes a first row, a second row, a third row, a fourth row, a fifth row, and a sixth row, the bumps among said first plurality of bumps which are on the first row are those lying on the innermost peripheral portions, the bumps among said first plurality of bumps which are on the sixth row are those lying on the outermost peripheral portions, and the bumps among said first plurality of bumps which are on a row with a higher number are set in position with increased spacing outwardly deviated from said innermost peripheral portions;

said first plurality of bumps, which are lying on the third row of a first column, a second column that is adjacent to said first column, a third column that is adjacent to said second column, and a fourth column that is adjacent to said third column, coupled to said first ground wiring; and said first plurality of bumps, which are lying on the sixth row of said first, second, third, and fourth columns, coupled to said first power supply wiring.

22. A flip-chip semiconductor device comprising:

a semiconductor substrate on which active elements are formed and which has a surface having a plurality of peripheral portions, said active elements including an I/O circuitry and a logic circuitry;

a first power supply wiring and a first ground wiring disposed in said semiconductor substrate;

a signal wiring disposed in said semiconductor substrate;

a first plurality of bumps arranged on said plurality of peripheral portions and selectively used for coupling said semiconductor substrate to a second substrate, said first plurality of bumps arranged in a matrix pattern of 6 rows by n columns and includes a first row, a second row, a third row, a fourth row, a fifth row, and a sixth row, the bumps among said first plurality of bumps which are on the first row are those lying on the innermost peripheral portions, the bumps among said first plurality of bumps which are on the sixth row are those lying on the outermost peripheral portions, and the bumps among said first plurality of bumps which are on a row with a higher number are set in position with increased spacing outwardly deviated from said innermost peripheral portions;

said first plurality of bumps, which are lying on the third row of a first column, the sixth row of a second column that is adjacent to said first column, the third row of a third column that is adjacent to said second column, and the sixth row of a fourth column that is adjacent to said third column, coupled to said first ground wiring; and said first plurality of bumps, which are lying on the sixth row of said first column, the third row of said second column, the sixth row of said third column, and the third row of said fourth column, coupled to said first power supply wiring.

* * * * *